(12) United States Patent
Choi et al.

(10) Patent No.: US 9,076,691 B2
(45) Date of Patent: Jul. 7, 2015

(54) THIN FILM TRANSISTOR ARRAY PANEL AND METHOD OF MANUFACTURING THE SAME

(71) Applicant: Samsung Display Co., Ltd., Yongin, Gyeonggi-Do (KR)

(72) Inventors: Shin Il Choi, Hwaseong-si (KR); Sang Gab Kim, Seoul (KR); Su Bin Bae, Gyeongsan-si (KR); Yu-Gwang Jeong, Anyang-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 71 days.

(21) Appl. No.: 13/875,722

(22) Filed: May 2, 2013

(65) Prior Publication Data

US 2014/0183535 A1    Jul. 3, 2014

(30) Foreign Application Priority Data

Dec. 27, 2012    (KR) .......................... 10-2012-0155107

(51) Int. Cl.
*H01L 21/00*    (2006.01)
*H01L 27/12*    (2006.01)
*H01L 27/32*    (2006.01)

(52) U.S. Cl.
CPC .......... *H01L 27/124* (2013.01); *H01L 27/1248* (2013.01); *H01L 27/322* (2013.01); *H01L 27/3248* (2013.01)

(58) Field of Classification Search
CPC ... H01L 2/124; H01L 27/322; H01L 27/1248; H01L 27/3248; H01L 27/1259

USPC ..................... 438/149, 151; 257/59, E29.273
See application file for complete search history.

(56) References Cited

U.S. PATENT DOCUMENTS

| | | | |
|---|---|---|---|
| 6,429,916 B1 * | 8/2002 | Nakata et al. .................. 349/106 |
| 7,468,767 B2 * | 12/2008 | Ha et al. ......................... 349/113 |
| 8,253,890 B2 | 8/2012 | Zhong et al. |
| 2006/0006385 A1 | 1/2006 | Park |
| 2009/0008646 A1 | 1/2009 | Kim et al. |
| 2009/0121232 A1 | 5/2009 | Huh et al. |
| 2011/0109852 A1 | 5/2011 | Kim et al. |

FOREIGN PATENT DOCUMENTS

| | | |
|---|---|---|
| JP | 2002350886 A | 12/2002 |
| JP | 2002350887 A | 12/2002 |
| KR | 1020100104189 A | 9/2010 |

* cited by examiner

*Primary Examiner* — Andy Huynh
(74) *Attorney, Agent, or Firm* — Cantor Colburn LLP

(57) ABSTRACT

A method of manufacturing a thin film transistor array panel includes: a gate insulating layer disposed on a gate electrode, a semiconductor disposed on the gate insulating layer, a source electrode opposite a drain electrode disposed on the semiconductor, a color filter disposed on the gate insulating layer, an overcoat disposed on the color filter and including an inorganic material. A first dry etching is performed using the photosensitive film pattern as a mask to etch the overcoat and provide a preliminary contact hole, through which a portion of the color filter is exposed. A second dry etching is performed using the overcoat as a mask to etch the color filter through the preliminary contact hole and to provide a contact hole, through which a portion of the drain electrode is exposed. A pixel electrode is connected to the drain electrode through the contact hole, on the overcoat.

7 Claims, 7 Drawing Sheets

THIN FILM TRANSISTOR ARRAY PANEL AND METHOD OF MANUFACTURING THE SAME

This application claims priority to Korean Patent Application No. 10-2012-0155107 filed on Dec. 27, 2012, and all the benefits accruing therefrom under 35 U.S.C. §119, the content of which in its entirety is herein incorporated by reference.

BACKGROUND (a) Field

Exemplary embodiments of the invention relate to a thin film transistor array panel and a method of manufacturing the thin film transistor array panel.

(b) Description of the Related Art

In general, a thin film transistor array panel is used as a circuit board for independently driving each pixel in a display device, e.g., a liquid crystal display device, an organic electroluminescence ("EL") display device, or the like. The thin film transistor array panel typically includes a scanning signal wire or a gate wire, which transfers a scanning signal, and an image signal line or a data wire, which transfers an image signal, a thin film transistor connected to the gate wire and data wire, a pixel electrode connected to the thin film transistor, and the like.

A color filter may be disposed in the thin film transistor array panel to ensure precise alignment between a pixel electrode and a color filter. In this case, the pixel electrode is typically connected through a contact hole of the color filter to the thin film transistor.

Currently, a demand for small-sized display panel with high resolution increases. In a small-sized display panel, an aperture ratio may be improved by reducing a size of the contact hole.

SUMMARY

Exemplary embodiments of the invention relate to a thin film transistor array panel, in which a color filter is disposed and a size of a contact hole for connecting a pixel electrode and a thin film transistor is substantially reduced.

In an exemplary embodiment of the invention, a thin film transistor array panel includes: a substrate, a gate line disposed on the substrate and including a gate electrode, a gate insulating layer disposed on the gate line, a semiconductor disposed on the gate insulating layer, a data line disposed on the semiconductor and including a source electrode, a drain electrode disposed on the semiconductor and opposite to the source electrode, a color filter disposed on the gate insulating layer, the data line and the drain electrode, an overcoat disposed on the color filter and including an inorganic material, a contact hole defined in the color filter and the overcoat, where the contact hole exposes the drain electrode, and a pixel electrode disposed on the overcoat and connected through the contact hole to the drain electrode, in which a plane shape of the contact hole in the overcoat and a plane shape of the contact hole in the color filter are substantially the same as each other.

In an exemplary embodiment, a width of the contact hole may be 10 micrometers (μm) or less.

In an exemplary embodiment, the overcoat may include silicon nitride, silicon oxide or carbon-injected silicon oxide.

In an exemplary embodiment, the thin film transistor array panel may further include: a passivation layer disposed between the color filter and the gate insulating layer, and between the data line and the drain electrode, in which a plane shape of the contact hole in the overcoat, the plan shape of the contact hole in the color filter and a plan shape of the contact hole in the passivation layer may be substantially the same as each other.

In another exemplary embodiment of the invention, a method of manufacturing a thin film transistor array panel includes: providing a gate line including a gate electrode on a substrate, providing a gate insulating layer on the gate line, providing a semiconductor on the gate insulating layer, providing a data line including a source electrode on the semiconductor, providing a drain electrode on the semiconductor, providing a color filter on the gate insulating layer, the data line and the drain electrode, providing an overcoat including an inorganic material on the color filter, providing a photosensitive film pattern on the overcoat, performing first dry etching using the photosensitive film pattern as a mask to etch the overcoat and to provide a preliminary contact hole, through which a portion of the color filter is exposed, performing second dry etching using the overcoat as a mask to etch the color filter through the preliminary contact hole and to provide a contact hole, through which a portion of the drain electrode is exposed, and providing a pixel electrode connected through the contact hole to the drain electrode on the overcoat.

In an exemplary embodiment, the performing the first dry etching may include using gas including a fluorine element.

In an exemplary embodiment, the performing the second dry etching may include using oxygen gas and the gas including the fluorine element.

According to the exemplary embodiments of the invention, a size of a contact hole is substantially reduced by providing an overcoat including an inorganic material on a color filter and etching a color filter using the overcoat as a mask, such that an aperture ratio of the thin film transistor array panel is substantially improved.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
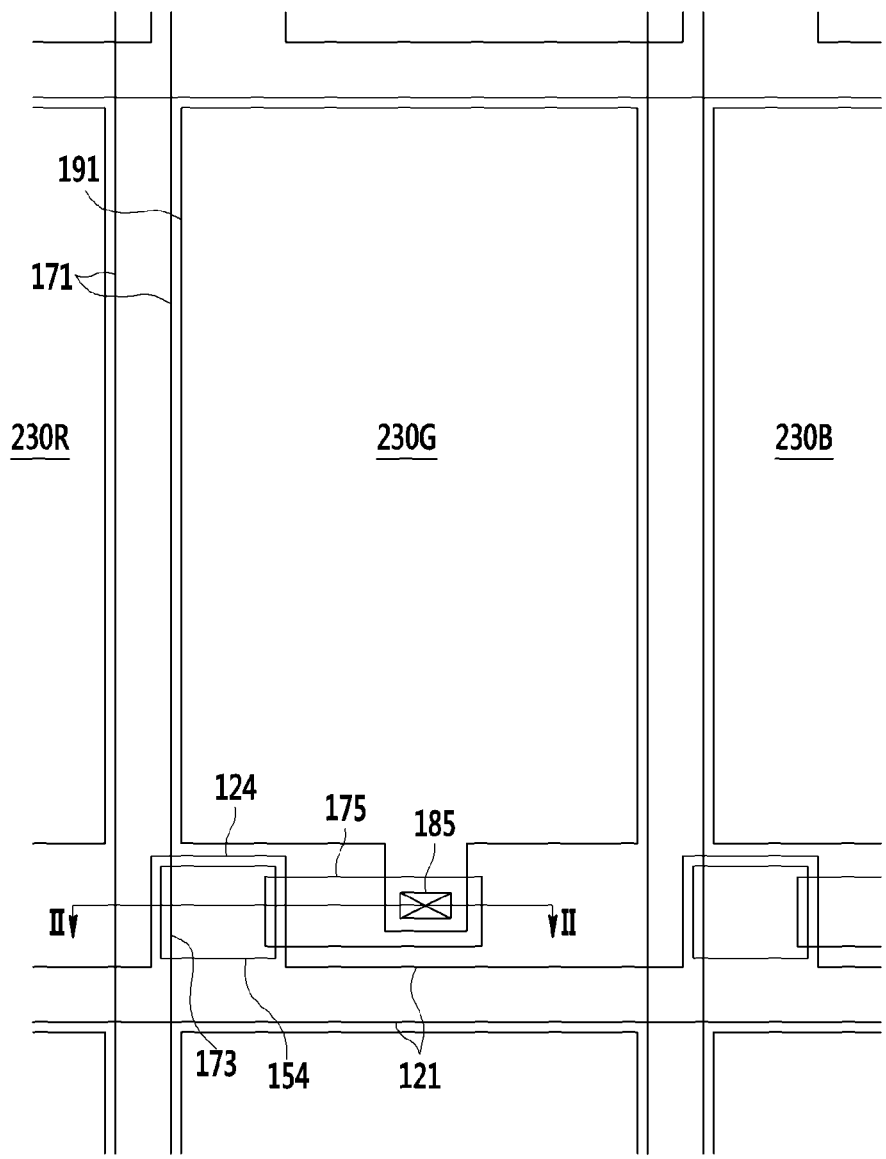
FIG. 1 is a top plan view of an exemplary embodiment of a thin film transistor array panel according to the invention.

The invention will be described more fully hereinafter with reference to the accompanying drawings, in which exemplary embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice.

Hereinafter, exemplary embodiments of a liquid crystal display according to the invention will be described in detail with reference to the accompanying drawings.

Figure 2:
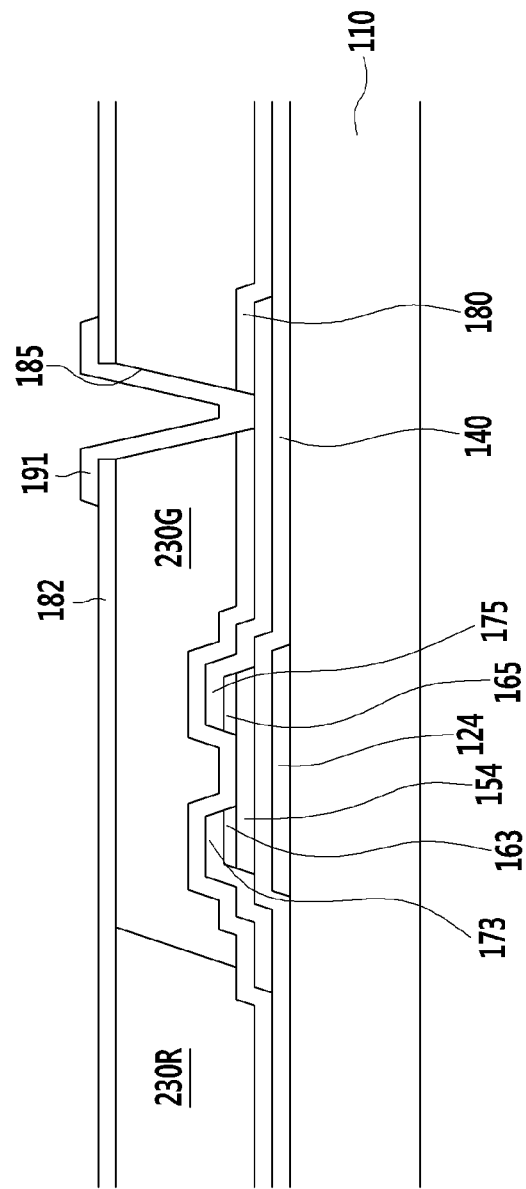
FIG. 2 is a cross-sectional view taken along line II-II of the thin film transistor array panel of FIG. 1.

FIG. 1 is a top plan view of an exemplary embodiment of a thin film transistor array panel according to the invention, and FIG. 2 is a cross-sectional view taken along line II-II of the thin film transistor array panel of FIG. 1.

As illustrated in FIGS. 1 and 2, an exemplary embodiment of the thin film transistor array panel includes a substrate 110 including an insulating material such as glass or plastic, for example, a gate line 121, which includes a gate electrode 124 and is disposed on the substrate 110. In such an embodiment, a gate insulating layer 140, a semiconductor 154, ohmic contacts 163 and 165, a data line 171 and a drain electrode 175 are sequentially disposed on the substrate 110 including the gate line 121 disposed thereon.

The gate line 121 transfers a gate signal, and extends substantially in a first direction, and the gate electrode 124 protrudes above the gate lines 121.

The data line 171 transports a data signal, and extends substantially in a second direction, which is substantially perpendicular to the first direction, and crossing the gate line 121. The data line 171 includes a source electrode 173. The drain electrode 175 extends substantially in the first direction, and is separated from the data line 171. The drain electrode 175 is disposed opposite to, e.g., facing, the source electrode 173 with respect to the gate electrode 124.

The semiconductor 154 is disposed on the gate electrode 124, and the ohmic contacts 163 and 165 are disposed on the semiconductor 142 at a predetermined position, e.g., between the semiconductor 154 and the source electrode 173, and between the semiconductor 154 and the drain electrode 175, such that contact resistance between the semiconductor 154 and the source electrode 173, and between the semiconductor 154 and the drain electrode 175 is substantially reduced.

The gate electrode 124, the source electrode 173 and the drain electrode 175 collectively define a thin film transistor ("TFT") together with the semiconductor 151, and a channel of the thin film transistor is formed in the semiconductor 154 between the source electrode 173 and the drain electrode 175.

A passivation layer 180 is disposed on the gate insulating layer 140, the data line 171 and the drain electrode 175.

Color filters 230R, 230G and 230B are disposed on the passivation layer 180.

An overcoat 182 is disposed on the color filters 230R, 230G and 230B. In an exemplary embodiment, the overcoat 182 may include an inorganic material such as silicon nitride (SiNx), silicon oxide (SiOx), or carbon-injected silicon oxide (SiOC), for example, and effectively prevents another layer from being contaminated by gas generated from the color filters 230R, 230G and 230B.

A contact hole 185, through which the drain electrode 175 is exposed, is defined in, e.g., formed through, the passivation layer 180, the color filters 230R, 230G and 230B, and the overcoat 182. Plane shapes of the contact hole 185 in the passivation layer 180, the overcoat 182 and the color filters 230R, 230G and 230B are substantially the same as each other. In an exemplary embodiment, a width of the contact hole 185 is about 10 micrometers (μm) or less. In an exemplary embodiment, the width of the contact hole 185 is defined as a length of the contact hole in a horizontal direction substantially parallel to the substrate 110.

A pixel electrode 191 is disposed on the overcoat 182. The pixel electrode 191 is connected through the contact hole 185 to the drain electrode 175, and receives a data voltage from the drain electrode 175.

As described above, in an exemplary embodiment, the contact hole 185 may be formed to have the width of about 10 μm or less, thus substantially improving the aperture ratio of the thin film transistor array panel.

In an exemplary embodiment, the passivation layer 180 is disposed on the gate insulating layer 140, the data line 171 and the drain electrode 175. In an alternative exemplary embodiment, the passivation layer 180 may not be omitted. In an exemplary embodiment, a light blocking member blocking light may be disposed on the pixel electrode 191.

Then, an exemplary embodiment of a method of manufacturing the thin film transistor array panel according to the invention will be described with reference to FIGS. 3 to 7 and FIG. 1.

FIGS. 3 to 7 are cross-sectional views illustrating an exemplary embodiment of a method of manufacturing the thin film transistor array panel according to the invention.

Figure 3:
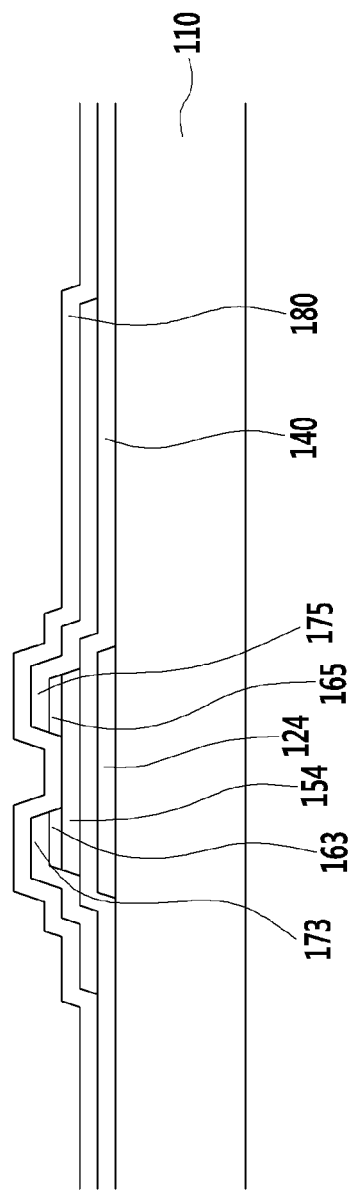
FIGS. 3 to 7 are cross-sectional views illustrating an exemplary embodiment of a method of manufacturing the thin film transistor array panel according to the invention.

Referring to FIG. 3, a gate electrode 124 and a gate insulating layer 140 are sequentially provided, e.g., formed, on a substrate 110, a semiconductor 154, ohmic contacts 163 and 165, a source electrode 173 and a drain electrode 175 are sequentially provided on the gate insulating layer 140, and a passivation layer 180 is provided on the gate insulating layer 140, the data line 171 and the drain electrode 175. In an exemplary embodiment, the gate electrode 124 and the gate line 121 may be provided together during a same process. In an exemplary embodiment, the source electrode 173 and the data line 171 may be provided together during a same process.

Figure 4:
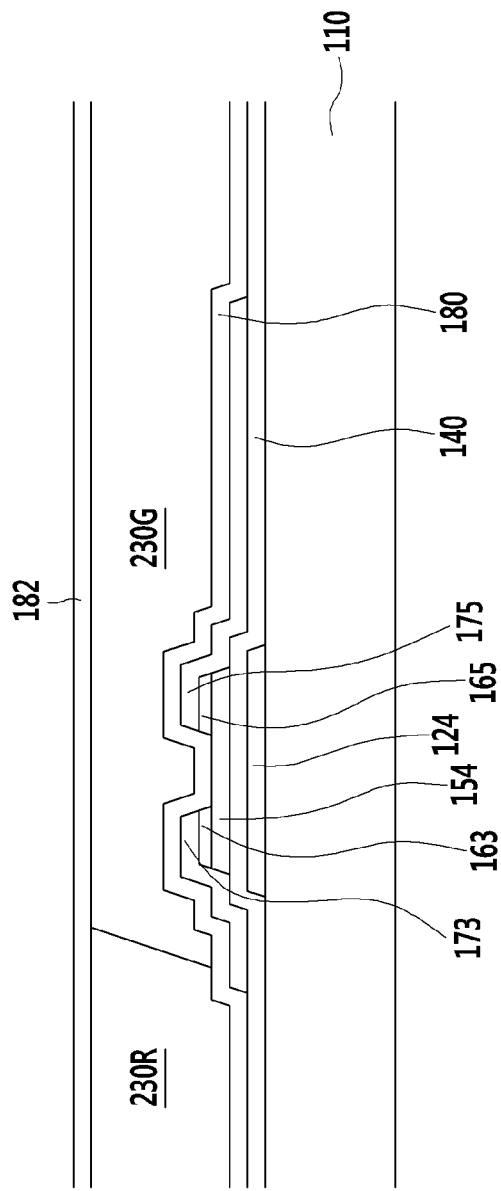

Referring to FIG. 4, color filters 230R and 230G, and an overcoat 182 are sequentially provided on the passivation layer 180. In an exemplary embodiment, the overcoat 182 includes an inorganic material such as silicon nitride (SiNx), silicon oxide (SiOx), or carbon-injected silicon oxide (SiOC).

Figure 5:
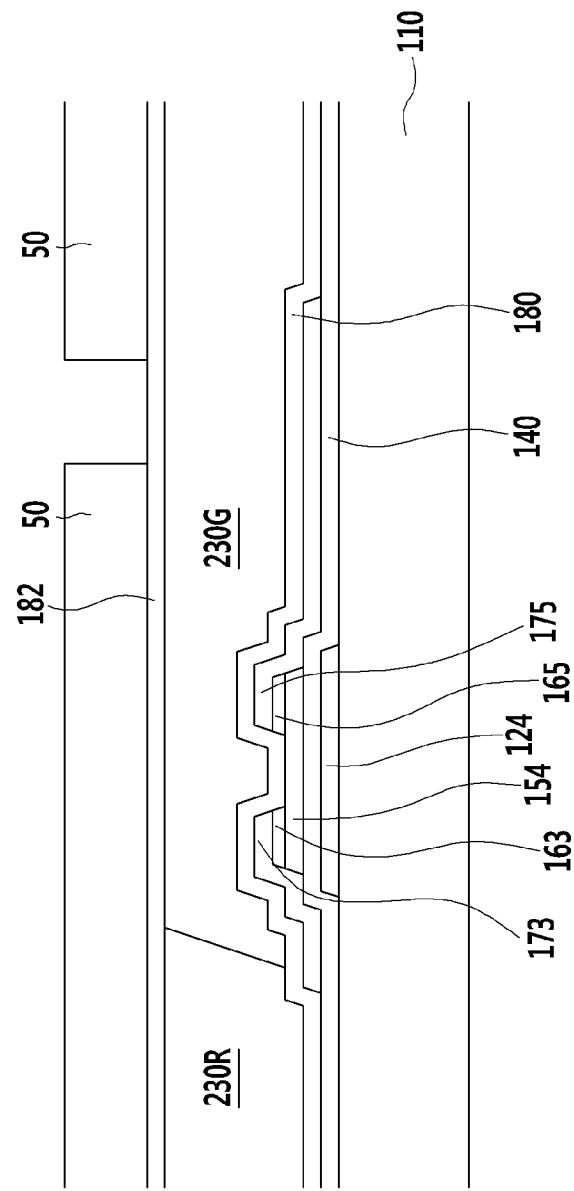

Referring to FIG. 5, a photosensitive film pattern 50 is provided on the overcoat 182. The photosensitive film pattern 50 exposes a portion of the overcoat 182.

Figure 6:
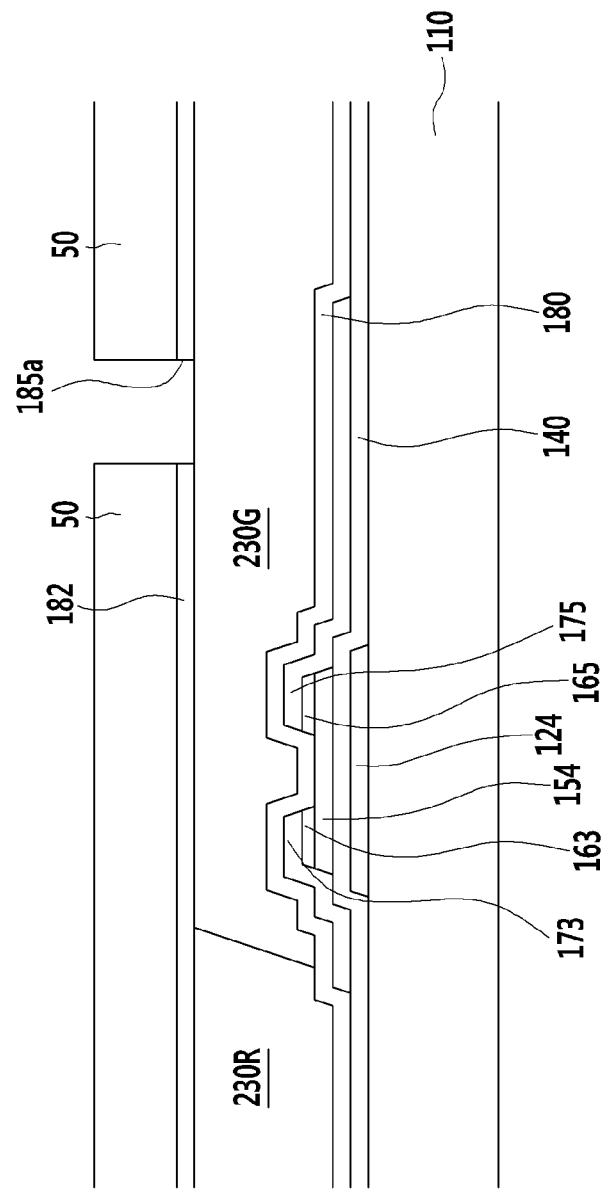

Referring to FIG. 6, first dry etching of etching the overcoat 182 using the photosensitive film pattern 50 as a mask is performed. A preliminary contact hole 185a, through which a portion of the color filter 230G is exposed, is formed by the first dry etching. In an exemplary embodiment, the first dry etching may be performed using gas including a fluorine element such as sulfur hexafluoride ($SF_6$), nitrogen trifluoride ($NF_3$), or carbon tetrafluoride ($CF_4$).

Figure 7:
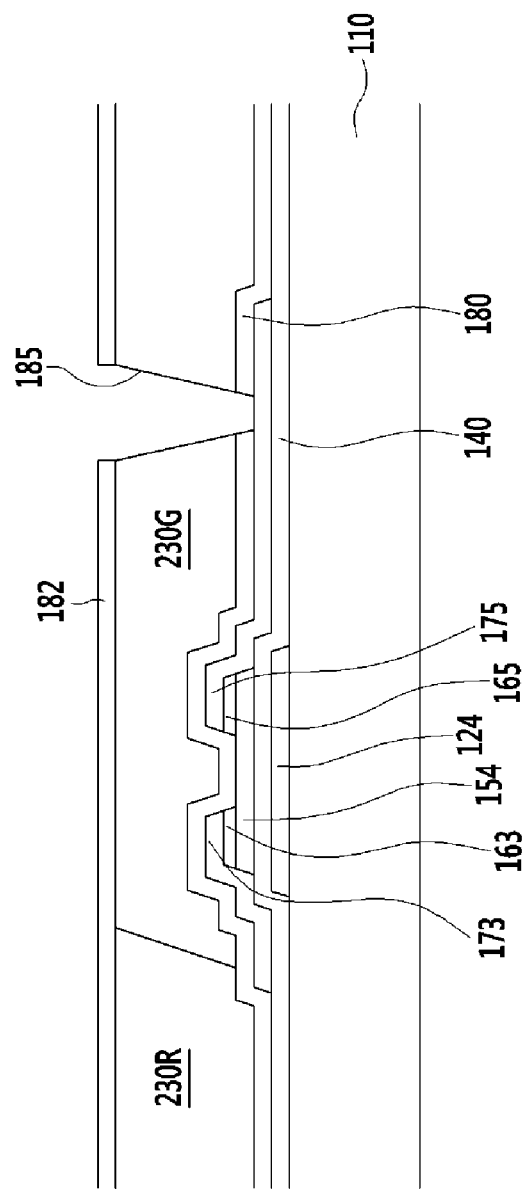

Referring to FIG. 7, after the photosensitive film pattern 50 is removed, second dry etching of etching the color filter 230G and the passivation layer 180 is performed using the overcoat 182 as a mask. A contact hole 185, through which a portion of the drain electrode 175 is exposed, is formed by the second dry etching. In an exemplary embodiment, the second dry etching is performed by adding gas including a fluorine element to oxygen ($O_2$) gas.

In an exemplary embodiment, the width of the contact hole 185 is about 10 μm or less, and the color filter 230G and the passivation layer 180 are etched using the overcoat 182 as the mask, such that a plane shape of the contact hole 185 in the overcoat 182 and a plane shape of the contact hole 185 in the passivation layer 180 are substantially the same as each other.

In an exemplary embodiment, the contact hole 185 may be formed to have the width of about 10 μm or less, thereby substantially improving the aperture ratio of the thin film transistor array panel.

In an alternative exemplary embodiment, the passivation layer 180 may not be formed. In an alternative exemplary embodiment, the contact hole 185 may be formed by etching the color filter 230G and the passivation layer 180 without removing the photosensitive film pattern 50.

Referring back to FIG. 1, a pixel electrode 191 is provided on the overcoat 182. The pixel electrode 191 is connected through the contact hole 185 to the drain electrode 175.

In an exemplary embodiment, a light blocking member (not shown), which blocks light, may be provided on the pixel electrode 191.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a thin film transistor array panel, the method comprising:
   providing a gate line comprising a gate electrode on a substrate;
   providing a gate insulating layer on the gate line;
   providing a semiconductor on the gate insulating layer;
   providing a data line including a source electrode on the semiconductor;
   providing a drain electrode on the semiconductor;
   providing a color filter on the gate insulating layer, the data line and the drain electrode;
   providing an overcoat comprising an inorganic material on the color filter;
   providing a photosensitive film pattern on the overcoat;
   performing a first dry etching to etch the overcoat and provide a preliminary contact hole exposing the color filter by using the photosensitive film pattern as a mask;
   removing the photosensitive film pattern;
   performing a second dry etching to etch the color filter through the preliminary contact hole and provide a contact hole by exposing the drain electrode by using the overcoat as a mask; and
   providing a pixel electrode, which is connected to the drain electrode through the contact hole, on the overcoat.

2. The method of claim 1, wherein the performing the first dry etching comprises using gas including a fluorine element.

3. The method of claim 2, wherein the performing the second dry etching comprises using oxygen gas and the gas including the fluorine element.

4. The method of claim 1, wherein a plane shape of the contact hole in the overcoat and a plane shape of the contact hole in the color filter are substantially the same as each other.

5. The method of claim 4, wherein a width of the contact hole is about 10 micrometers or less.

6. The method of claim 5, wherein the overcoat comprises silicon nitride, silicon oxide or carbon-injected silicon oxide.

7. The method of claim 1, further comprising:
   providing a passivation layer between the color filter and the gate insulating layer, and between the data line and the drain electrode,
   wherein a plane shape of the contact hole in the overcoat, a plane shape of the contact hole in the color filter and a plane shape of the contact hole in the passivation layer are substantially the same as each other.

\* \* \* \* \*